United States Patent [19]

Knauer et al.

[11] 4,213,105

[45] Jul. 15, 1980

[54] TRANSVERSAL FILTER HAVING AT LEAST ONE ANALOG SHIFT REGISTER, AND A METHOD FOR ITS OPERATION

[75] Inventors: Karl Knauer, Gauting; Hans J. Pfleiderer, Zorneding, both of Fed. Rep. of Germany

[73] Assignee: Siemens Aktiengesellschaft, Berlin & Munich, Fed. Rep. of Germany

[21] Appl. No.: 856,004

[22] Filed: Nov. 30, 1977

[30] Foreign Application Priority Data

Dec. 23, 1976 [DE] Fed. Rep. of Germany ....... 2658524

[51] Int. Cl.² .................. H03H 7/28; H03K 5/13; G11C 19/18; G11C 27/00
[52] U.S. Cl. ............................ 333/165; 307/221 D; 333/166
[58] Field of Search .................. 333/70 T, 70 R, 70 A, 333/165, 166, 173; 307/221 R, 221 C, 221 D; 357/24; 364/824, 825, 862

[56] References Cited

U.S. PATENT DOCUMENTS 4,035,628 7/1977 Lampe et al. .................. 333/70 T X

OTHER PUBLICATIONS

Buss et al.–"Transversal Filter Using Charge-Transfer Devices" in "IEEE Journal of Solid State Circuits", vol. SC-8, No. 2, Apr. 1973; pp. 138-146.

Puckette et al.–"Bucket-Brigade Transversal Filters" in IEEE Trans. on Circuits and Systems, vol. CAS-21, No. 4, Jul. 1974; pp. 502-510.

Primary Examiner—Alfred E. Smith
Assistant Examiner—Marvin Nussbaum
Attorney, Agent, or Firm—Hill, Van Santen, Steadman, Chiara & Simpson

[57] ABSTRACT

In the illustrated embodiments, the space required for a transversal filter with a given number of evaluation factors is reduced by providing valuator circuits embodying such factors as inputs to each successive capacitor element of a charge shifting device. In one mode of operation the signal to be filtered is sampled via the valuator circuits on each charge shift cycle while readout from the series output occurs on alternate cycles. Since the readout scanning frequency is a submultiple of the input sampling frequency, the filter is well suited as a low-pass filter.

2 Claims, 8 Drawing Figures

TRANSVERSAL FILTER HAVING AT LEAST ONE ANALOG SHIFT REGISTER, AND A METHOD FOR ITS OPERATION

CROSS-REFERENCES TO RELATED APPLICATIONS

The present application is related to a joint application of the present inventors with Max Schlichte, U.S. Ser. No. 832,232 filed Sept. 12, 1977 and to a sole application of Karl Knauer, U.S. Ser. No. 832,234 filed Sept. 12, 1977. The description and drawings of both of these earlier filed pending applications are incorporated herein by reference.

BACKGROUND OF THE INVENTION

The present invention relates to a transversal filter having at least one analog shift register which exhibits a number of parallel inputs and one series output, with an additional number of individual valuator or evaluating circuits which can be preset, each valuator circuit exhibiting at least one signal input for the input of the signal to be filtered, and at least one output, whereby each valuator circuit introduces a preselected individual valuation factor and supplies a charge at its output which (except for the individual valuation factor) is equal to the difference between the respective signal value of the signal to be filtered and a prescribed minimum value which is smaller than or equal to the value of the signal minimum, or which (except for the individual valuation factor) is equal to the difference between a maximum value which is greater than or equal to the value of the signal maximum and the respective signal value, wherein the output of each valuator circuit can be connected to an apertaining parallel input via a control circuit, and wherein the storage capacity of each storage location of the shift register is at least sufficiently large so that it can always accommodate the maximum charge amount supplied by the preceding storage location, and if it is a storage location with a parallel input, it can additionally accommodate the maximum charge supplied by the one or more valuator circuits assigned in accordance with the prior patent application Ser. No. 832,232 filed Sept. 12, 1977, and the method for its operation.

For such transversal filters the endeavor exists to keep their required space as small as possible. Thereto the earlier application already suggested several measures. A first such measure consists in that the shift register is divided, whereas a second measure consists in connecting more than one valuator circuit to a parallel input.

SUMMARY OF THE INVENTION

It is the objective of the present invention to disclose a transversal filter of the initially mentioned type which permits an additional decrease of the space required.

The objective is resolved in that the analog shift register is a charge shifting device in which at least one series of capacitor elements, consisting of at least one respective insulating layer capacitor and/or barrier layer capacitor, is provided on a surface of a substrate of doped semiconductor material, each capacitor element of said series of capacitor elements being operable to shift the stored charge thereof to a next succeeding capacitor element in response to one respective shift pulse sequence from a number of at least two shift pulse sequences, phase-shifted in relation to one another, which can be connected to the outer electrodes of each capacitor element, that in the case of each capacitor element a parallel input is provided, that as many capacitor elements and valuator circuits for the realization of one single filter function, respectively, are provided, as valuator circuits for the realization of the filter function and capacitor elements are prescribed, respectively, and that each parallel input is connected to an output of a valuator circuit. Thereby, the required space of the transversal filter can be considerably decreased as now parallel inputs are not only present at the capacitor elements designated for one and the same shift pulse sequence, as suggested in the earlier patent applications for the realization of one filter function only. This also holds true for the variant disclosed in the earlier joint patent application U.S. Ser. No. 832,232 in which a shift register is utilized for the four-phase-operation and in which, additionally, a capacitor elements which are designated for a second of the four shift pulse sequences, additional parallel inputs are provided. On the other hand, more valuator or evaluating circuits for the realization of a desired filter function can be utilized without additional required space, in contrast to transversal filters of the prior patent.

The inventive transversal filter is operated such that the signal to be filtered is applied to the inputs of all evaluating or valuator circuits, that the evaluating circuits are operated synchronously with the pulse frequency of the shifting pulse sequences (with which information is shifted from capacitor element to capacitor element), that a read-in operation into the charge shifting device is effected at each capacitor element by operation of the associated evaluating circuit, and that the filtered signal is taken out of the series output.

An essential additional advantage of the transversal filter disclosed consists, in conjunction with the operation method disclosed, that several filter properties can be realized with the prescribed evaluating or valuator circuits for the realization of one prescribed filter function. Thus, a given disclosed filter is exceedingly well suited as a low-pass filter.

Other objects, features and advantages of the invention will be apparent from the following detailed description taken in connection with the accompanying sheets of drawings.

DETAILED DESCRIPTION OF THE PREFERRED EMBODIMENT

Figure 1:
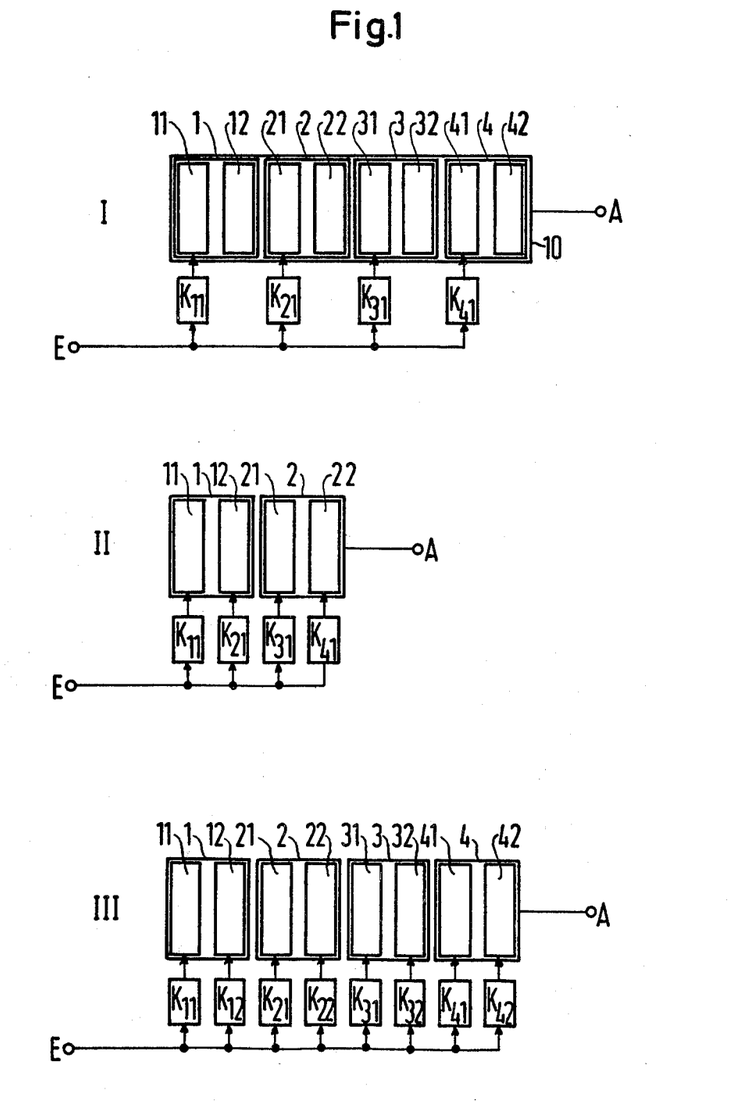
FIG. 1 schematically illustrates embodiments I through III of transversal filters for comparison.

Embodiment I in FIG. 1 discloses an embodiment of a transversal filter in accordance with the first figure of the prior joint patent application. The charge shifting device is referenced 10, and is specifically realized as a charge-coupled shifting device with two phases of shift pulse sequences. Said charge shifting device could also consist of a bucket brigade circuit. The structure of charge-coupled shifting devices for two phase operation can be derived, for example, from the German Offenlegungsschrift No. 2,201,150. In accordance therewith, each stage of this charge-coupled shifting device (called storage location in the prior patent application) consists of two adjoining capacitor elements. The stages are referenced 1 through 4, and the capacitor elements are referenced 11, 12, 21, 22, 31, 32, 41 and 42 in FIG. 1. The first shift pulse sequence is applied to the outer electrodes of the capacitor elements whose reference symbols exhibit a 1 in the units position, whereas the second shift pulse sequence is applied to the outer capacitor electrodes of the remaining capacitor elements, the second shift pulse sequence being essentially inverse in relation to the first sequence. By means of the combination of both shift pulse sequences, the information is shifted from capacitor element to capacitor element in the shifting direction. (In a device for n-phaseoperation, n pulse sequences are necessary which are phase-shifted in relation to one another). Each capacitor stage such as 1 consists of two adjoining insulating layer capacitors such as 11 and 12, wherein, for example, the electrically insulating layer of one exhibits a greater layer thickness than the other. The outer capacitor electrodes of these two insulating layer capacitors are connected with one another in an electrically conductive manner. The capacitor elements, designated for the first pulse sequence, namely the capacitor elements 11, 21, 31 and 41, exhibit one respective parallel input. The parallel input is preferably situated in the insulating layer capacitor having the lower layer thickness. Each of these parallel inputs is connected with an output of one respective valuator circuit $K_{11}$, $K_{21}$, $K_{31}$, and $K_{41}$. The reference symbols $K_{11}$ through $K_{41}$ simultaneously represent the valuation factors of the individual valuator circuits. The input of each valuator circuit is connected to a joint input E for the signal to be filtered. The series output of shift register 10 is referenced A.

The filter II now represents a first variant of the inventive filter. There, each capacitor element exhibits a parallel input connected to the output of one of the respective valuator circuits $K_{11}$ through $K_{41}$. As can be concluded from II, only four capacitor elements 11, 12, and 21 and 22 are required vis-a-vis filter I. The rest remains the same. Thus, one obtains a space-saving of about fifty percent vis-a-vis the original embodiment.

The filter III represents an additional variant of an inventive filter which differs from filter I in that the capacitor elements 12, 22, 32 and 42 exhibit one respective parallel input, also, and that to each of these respective parallel inputs one respective additional valuator circuit $K_{12}$, $K_{22}$, $K_{32}$ and $K_{42}$ is connected. The new reference symbols $K_{12}$ through $K_{42}$ here also simultaneously represent the valuation factors of the individual additional valuator circuits. The inputs of these additional valuator circuits are connected to the input E.

The invention is not limited to charge shifting devices for the two-phase operation. In the utilization of charge shifting devices for the n-phase operation, each stage of the charge-coupled shifting device consists of n capacitor elements. In accordance therewith, for the variant II the required space can be generally decreased by the factor of 1/n, whereas for the variant III n times as many valuator circuits can be connected without increasing the space required.

It is now of essential significance how the pulse frequency of the shift pulse sequences is selected for the chargecoupled shifting devices of the filters II and III. Two cases are of particular interest: For one, the pulse frequency is selected as the pulse frequency $f_O$ for the filter I in accordance with the prior patent applications, whereby the output frequency of the filtered signal arriving at output A is maintained there as in the prior patent applications, or in the other case the pulse frequency of the shift pulses is selected to be $f_O/2$ (generally $f_O/n$) whereby the scanning frequency, with the aid of which the signal to be filtered is sampled at the input E, is maintained as in filter I.

In any case, the output frequency at the output A is smaller by two times (n-times) than the scanning frequency at the input E.

Thus, four cases in total can be differentiated for the filters II and III in FIG. 1. If one references the pulse frequency as $f_O$ for filter I in FIG. 1 as above, the pulse frequency for II with $f_{II}$, and the pulse frequency for III with $f_{III}$, said cases can be differentiated in the following:

$f_{II}=f_O$, $f_{III}=f_O$, $f_{II}=f_O/n$ and $f_{III}=f_O/n$.

In the specific case of FIG. 1 the number of phases of shift pulse sequences is two, i.e. $n=2$.

Figure 2:
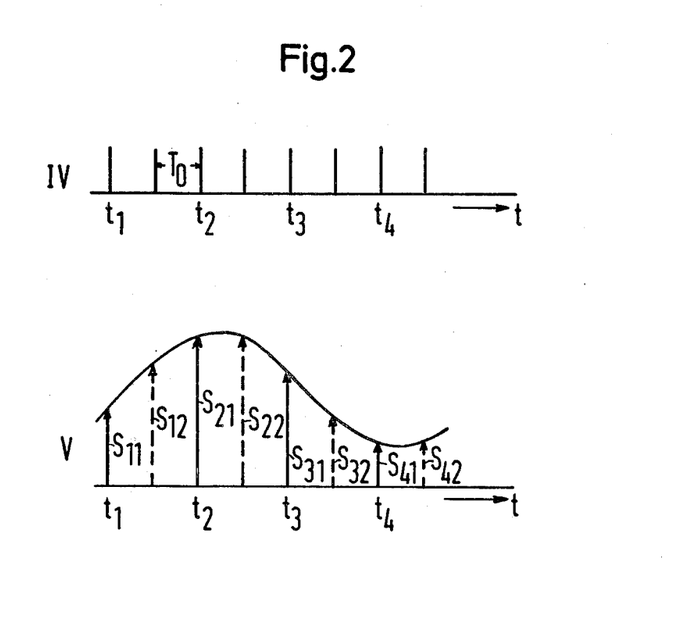
FIG. 2 illustrates shifting pulses of frequency $f_0$ during the time t in a diagram IV, and underneath the chronological course of a signal to be filtered in a diagram V.

FIG. 2 serves now as additional explanation. The timing of the shifting pulses making up the two shift pulse sequences for the charge-coupled shifting device I is schematically illustrated by successive vertical lines during the time t in diagram IV. The pulse interval is referenced $T_O$. In diagram V, underneath, an arbitrarily selected form of a signal to be filtered is illustrated during the time t, also. For the pulse frequency of the shifting pulses holds true: $f_O=1/T_O$. In filter I, the signal to be filtered is scanned with the aid of the pulse frequency $f_O/2$ (generally $f_O/n$). The scanned signal values are referenced $S_{11}$, $S_{21}$, $S_{31}$ and $S_{41}$. If the input signal to the filter I were sampled at a frequency $f_O$, additional signal values would be scanned. These signal values additionally scanned are also entered in FIG. 2 and referenced $S_{12}$, $S_{22}$, $S_{32}$, and $S_{42}$.

The capacitor elements are provided with two-digit reference symbols xy in the filter I. Therein x represents the current number of the stage of the charge-coupled shifting device whereby it is counted toward the output A. The letter y represents the current number of the capacitor element in one stage, whereby one also counts toward the output A (in filter I, y possesses the numbers 1 and 2, whereas it generally includes the numbers 1 through n). In filter I the valuation factors are referenced $K_{xy}$, in a corresponding manner. In accordance therewith, for example, the valuation factor $K_{21}$ represents the valuator circuit connected to the capacitor element 21 in the device I in accordance with FIG. 1. $K_{22}$ would be that valuator circuit which would have to be connected to the capacitor element 22 in the device I.

Now, the signal values assigned to the valuation factors can be generally illustrated in the form $K_{xy} \cdot S_{uv}$. The significance of x and y is already provided, u is the current index of the scanning points $t_1$, $t_2$, etc., (see FIG. 2), v includes the numbers of 1 through n and provides the additional scanning times between $t_u$ and $t_{u+1}$ if filter I is operated with the pulse frequency of $n \cdot f_O$.

The physical structure of the filter of embodiment I of FIG. 1 corresponds to that of the second figure of the prior applications except that for two phase operation, only capacitor elements for two phases are required (i.e., those designated 111, 112, 121, 122, 131, 132, 141, 142 in the second figure), the pulses at $t_1$, $t_2$, $t_3$, $t_4$, etc., in part IV of FIG. 2, being supplied to one shift pulse line (32), and the alternate pulses, corresponding to $S_{12}$, $S_{22}$, $S_{32}$, $S_{42}$, FIG. 2, being supplied to the other shift pulse line (31). The common gate (60) of the second figure of the prior application is operated at a frequency of $f_O/2$, so that the input signal at E is sampled according to the third figure of the prior applications prior to each of times $t_1$, $t_2$, $t_3$, $t_4$, etc., FIG. 2. In the embodiments of parts II and III of FIG. 1, the gate may be a gate (such as 60 in the second figure of the prior applications) common to all valuator circuits $K_{11}$, $K_{21}$, $K_{31}$, $K_{41}$ (part II) and $K_{11}$, $K_{12}$, $K_{21}$, $K_{22}$, $K_{31}$, $K_{32}$, $K_{41}$, $K_{42}$ (part III) and operated with a frequency equal to the desired input signal sampling rate, e.g. $f_O$ or $f_O/2$.

FIGS. 3 through 7 respectively illustrate a matrix-shaped scheme of the valuated signals $K_{xy} \cdot s_{uv}$. In each scheme, the evaluated signal values of $K_{xy} \cdot s_{uv}$ relevant for the output signal formation are respectively surrounded with a circle. Specific circles are connected by lines. This indicates that the values of $K_{xy} \cdot s_{uv}$ in these circles are added for the formation of output values of the signal to be filtered.

Figure 3:
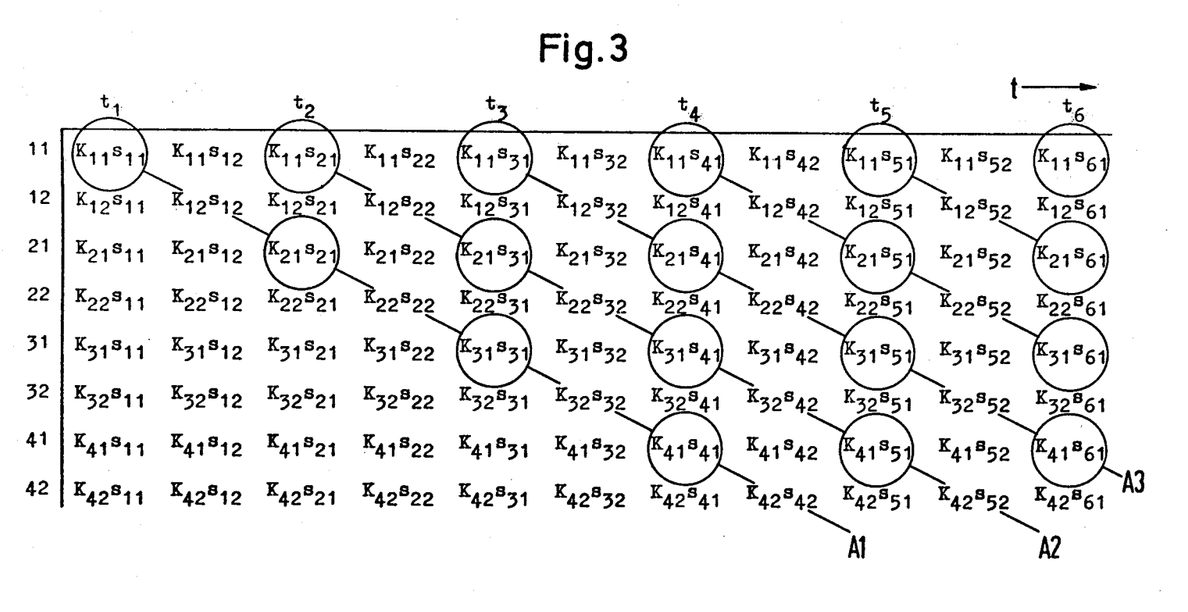
FIGS. 3 through 7, respectively, illustrate a matrix-shaped scheme for explaining the operation of the embodiments of FIG. 1.

The scheme in accordance with FIG. 3 relates to the device I in FIG. 1. At the time $t_1$, the value of $K_{11} \cdot s_{11}$ is read into the capacitor element 11. Simultaneously, the values of $K_{21} \cdot s_{11}$, $K_{31} \cdot s_{11}$, and $K_{41} \cdot s_{11}$ are read into the capacitor elements 21, 31 and 41. These latter read-in values, however, are not relevant for the formation of the output signal and are thereforeas in the following also-not surrounded by circles. At the time $t_2$, ergo after an intermediate pulse, into which by nature no read-in can take place, the value $K_{11} \cdot s_{21}$ is read-in, and simultaneously the value $K_{21} \cdot s_{21}$ is read into the capacitor element 21. The remaining, simultaneously read-in values of $K_{31} \cdot s_{21}$ and $K_{41} \cdot s_{41}$ are again not relevant for the formation of the output signal. As the value of $K_{11} \cdot s_{11}$ is shifted into the capacitor element 21 at the time of $t_2$, the value of $K_{21} \cdot s_{21}$ is added to said element. As already mentioned, this is illustrated by the connecting line between the two corresponding circles. Now, the logical continuation of the scheme results in the appearance of the first signal value of $A_1$ of the filtered signal at the time of $t_5$, the second signal value of $A_2$ etc. at the time of $t_6$ at the output A. For the scanning frequency $f_E$, with the aid of which the signal to be filtered is scanned, and the scanning frequency $f_A$, with the aid of which the filter signal is scanned, holds true: $f_E = f_A = f_O/2$.

Figure 4:
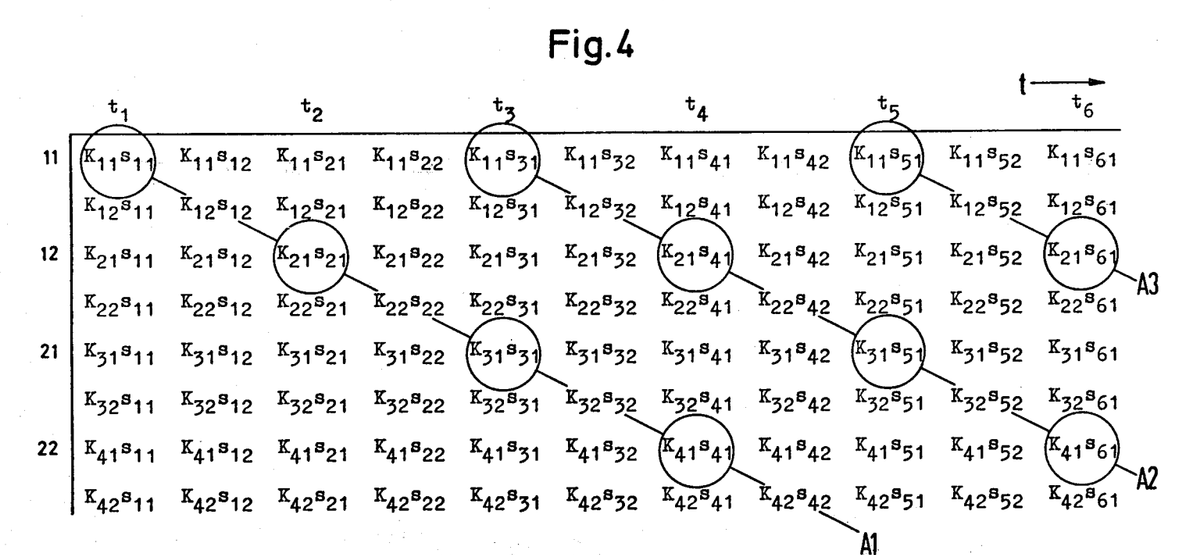

The formation of the output signal for the filter II in the illustrated scheme in FIG. 4 is illustrated in the case that the pulse frequency of the shifting pulse $f_{II} = f_O/2$ is selected, whereby, as above, $f_E = f_O/2$ is, thus, the scanning frequency maintained, as there the reading-in takes place with every pulse. At the time of $t_1$, the value of $K_{11} \cdot s_{11}$ is read onto the capacitor element 11. At the time of $t_2$, the value of $K_{21} \cdot s_{21}$ (the evaluator circuit $K_{21}$ indeed is connected to the capacitor element 12 in the device in accordance with II) is read in. As the value of $K_{11} \cdot s_{11}$ is shifted into the capacitor element 12 at the time of $t_2$, the value of $K_{21} \cdot s_{21}$ is added to said element. The logical continuation of the method now results that the first signal value $A_1$ of the filter signal appears at the output A at the time of $t_5$, the next signal value $A_2$ appears at the time $t_7$ etc. Thus, $f_A = f_E/2$ holds true for the scanning frequency $f_A$ at the output A. For said case generally holds true that the scanning frequency $f_A$ is decreased by the 1/n multiple in relation to $f_E$ at the output A if a charge-coupled shifting device is utilized for the n-phase operation. Thus, this filter is exceedingly well suited as a low-pass filter. In correspondence with the greater band width $B_E$ of the input signal, the signal is scanned with the frequency of $f_E = 2B_E$ (generally n $B_E$). However, at the output the signal must be only reproduced with a frequency which corresponds with the lesser band width $B_A$ so that now the frequency of $f_A = f_E = 2B_A$ (generally $nB_A$) results. The very same is obtained with the filter II in accordance with FIG. 1 together with the type of operation in accordance with the scheme in FIG. 4. Moreover, the area [surface] of the filter is decreased by the factor of 1/n.

Figure 5:
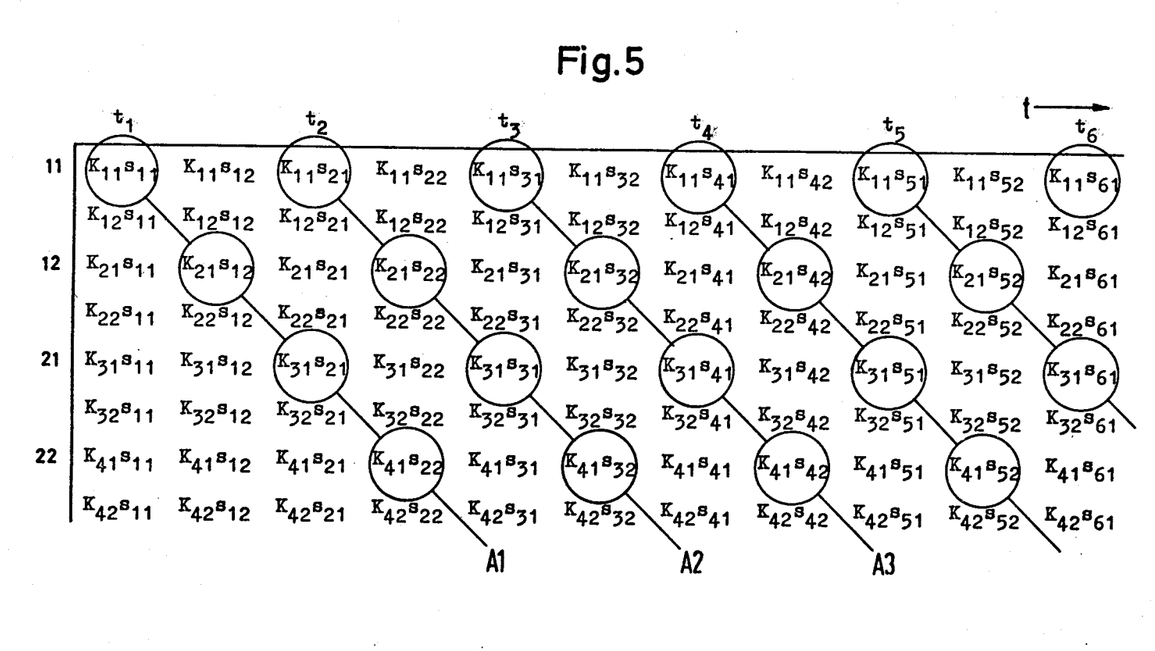

The scheme in accordance with FIG. 5 provides the case in which the ilter II in FIG. 1 is operated with the pulse frequency $f_O$, and thus the signal to be filtered—vis-a-vis the case in accordance with FIG. 4—is scanned with double the frequency $f_E = f_O$. If at the time of $t_1$ the value $K_{11} \cdot s_{11}$ is read in, the value $K_{21} \cdot s_{12}$, appertaining to the intermediate value of $s_{12}$, is read in with the next pulse, and thus before the time $t_2$. A logical continuation of the scheme results that at the time $t_3$, the first signal value of $A_1$ of the filter signal appears at the output A, at the time $t_4$ the next signal value $A_2$ etc. . . . Thus, the filtered signal at the output A is scanned with the same frequency of $f_A = f_O/2$ as in the filter I in accordance with the scheme in FIG. 3.

Figure 6:
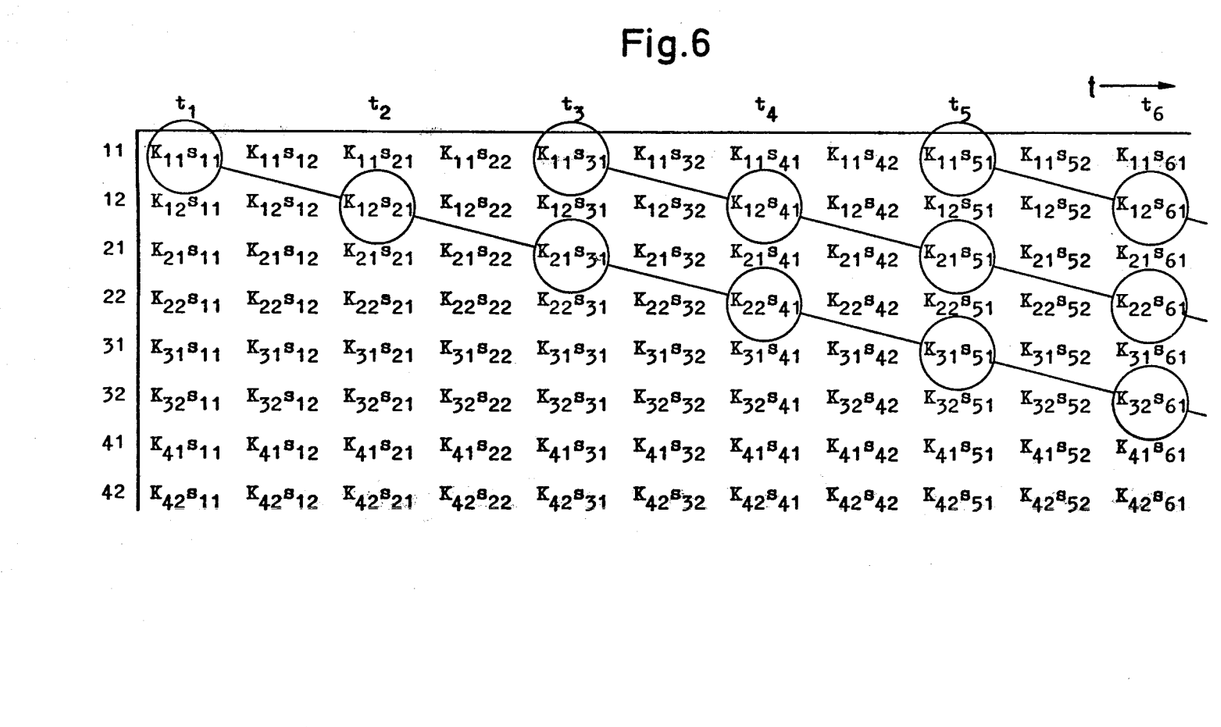

The scheme illustrated in FIG. 6 provides the case that the device III in accordance with FIG. 1 is operated with the pulse frequency $f_{III} = f_O/2$. If $K_{11} \cdot s_{11}$ is read in, the value of $K_{12} \cdot s_{21}$ at the time $t_2$ is read in addition, etc. . . . A logical continuation of the scheme results that the first signal value $A_1$ of the filtered signal appears at the output A at the time of $t_9$, the next signal value $A_2$ appears at the time of $t_{11}$ etc. . . . Thus, the filter signal is scanned with the frequency of $f_A = f_O/4$.

Figure 7:
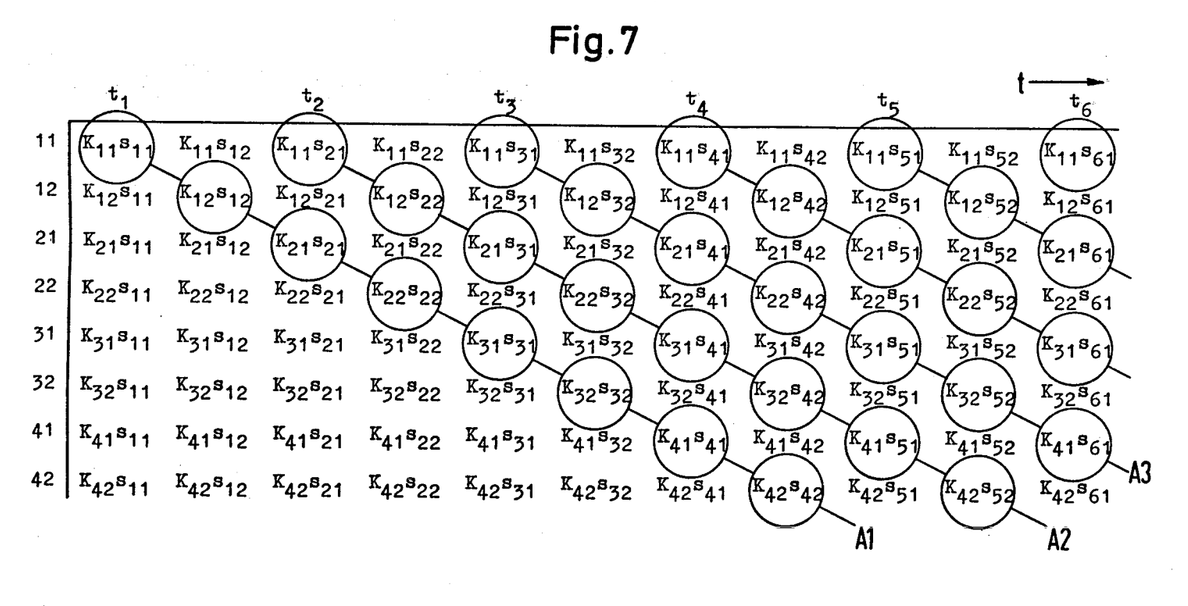

The scheme illustrated in FIG. 7 provides the case that the device III in FIG. 1 is operated with a pulse frequency of $f_{III} = f_O$. The signal to be filtered is scanned at the input E with the frequency of $f_O$, whereas the scanning frequency for the filtered signal at the output A is equal to the original scan frequency. The first signal value $A_1$ of the filtered signal appears at the output A at the time $t_5$, the next signal value $A_2$ appears at the time $t_6$ etc. . . .

Figure 8:
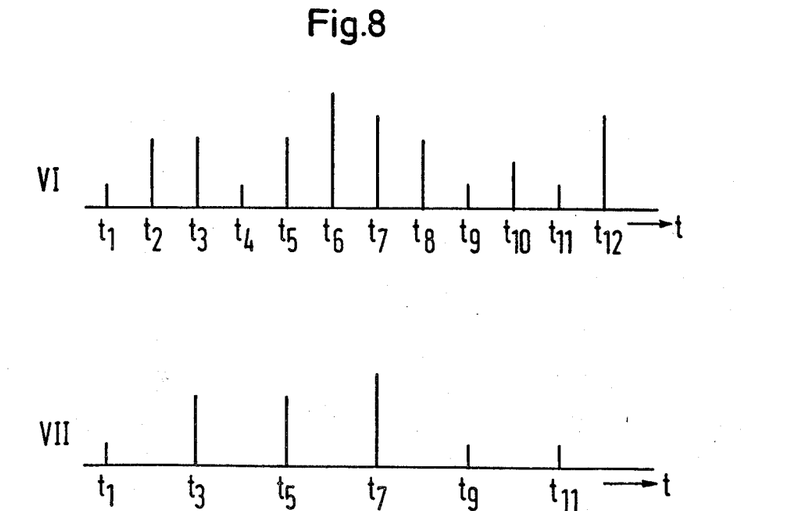
FIG. 8 illustrates the output signals of respective filter variants during the time t in diagrams VI and VII.

Diagram VI in FIG. 8 discloses a sample for a filtered signal as it appears at the output A of the device I in FIG. 1 when operated with the pulse frequency $f_O$. Diagram VII, for comparison, illustrates the output signal at the output A of filter II in FIG. 1 for the same input signal, wherein this device is operated therein by the pulse frequency $f_O/2$. The low-pass filter properties of this filter II can clearly be recognized. At the output A of the device II—vis-a-vis the output A of filter I—only every other signal value appears as here the filtered signal is reproduced with half the frequency. The signal values, appearing at the same time in both the devices, are identical.

As previously stated, the gate circuit controlling sampling of the input signal at E can be common to all capacitor elements in embodiments II and III of FIG. 1 even though the valuation circuits are associated with plural phases of the shift pulse sequence. This is possible since the function of the gate electrode (such as indicated at 60 in the second figure of the prior applications) is to prepare for transfer of charge from each valuator circuit, and actual charge transfer to the respctive associated capacitor elements of the respective phases is effected in response to a large amplitude of the shifting pulse voltage for such phase. The timing of the actual charge transfers is thus accurately portrayed by the circled entries in FIGS. 4–7.

It will be apparent that many modifications and variations may be effected without departing from the scope of the novel concepts and teachings of the present invention.

We claim as our invention:

1. A transversal filter comprising at least one analog shift register having a series of successive storage locations, a number of parallel inputs and a series output, having an additional number of individual valuator circuits which can be preset to represent respective individual valuation factors, each valuator circuit having at least one signal input for the input of the signal to be filtered, and at least one output, each valuator circuit supplying at its output a quantity of charge which is a function of the preset individual valuation factor thereof and a differential amount equal to the respective signal value of the signal to be filtered minus a prescribed minimum value smaller than or equal to the value of the signal minimum, or a differential amount equal to a maximum value larger than or equal to the value of the signal maximum minus the respective signal value, the output of each valuator circuit being connected to an apertaining paralel input of the shift register, and the holding capacity of each storage location of the shift register being at least such that said storage location can always accommodate the maximum quantity of charge supplied by a preceding storage location and can additionally always accommodate the maximum charge supplied by an assigned valuator circuit, the analog shift register being a charge shifting device having at least one series of capacitor elements providing respective ones of the successive storage locations, each comprising a substrate of doped semiconductor material and outer electrode means for forming at least one respective insulating layer capacitor and/or barrier layer capacitor on a surface of the substrate, said charge shifting device being operable in response to a number of at least two shift pulse sequences, phase-shifted in relation to one another, and applied to the outer electrode means of respective sets of said capacitor elements, and said charge shifting device having a number of valuator circuits preset to represent individual valuation factors which number is sufficient for the realization of a given filter function, and having one of the respective capacitor elements thereof connected to the output of each of the respective valuator circuits, the number of capacitor elements of said series being essentially equal to the number of said valuator circuits.

2. A method for the operation of a transversal filter in accordance with claim 1, characterized in that the signal to be filtered is applied to the inputs of all valuator circuits, and that the valuator circuits are operated for read-in to the charge shifting device with each pulse of the shift pulse sequences with the aid of which information is shifted from capacitor element to capacitor element, and that the filtered signal is taken at the series output.

* * * * *